US007368215B2

(12) United States Patent
Munnelly et al.

(10) Patent No.: US 7,368,215 B2
(45) Date of Patent: *May 6, 2008

(54) ON-PRESS DEVELOPABLE IR SENSITIVE PRINTING PLATES CONTAINING AN ONIUM SALT INITIATOR SYSTEM

(75) Inventors: Heidi M. Munnelly, Windsor, CO (US); Geoffrey Horne, Fort Collins, CO (US); Jianbing Huang, Trumbull, CT (US)

(73) Assignee: Eastman Kodak Company, Rochester, NY (US)

( * ) Notice: Subject to any disclaimer, the term of this patent is extended or adjusted under 35 U.S.C. 154(b) by 176 days.

This patent is subject to a terminal disclaimer.

(21) Appl. No.: 10/436,506

(22) Filed: May 12, 2003

(65) Prior Publication Data

US 2004/0229165 A1 Nov. 18, 2004

(51) Int. Cl.
*G03F 7/004* (2006.01)

(52) U.S. Cl. .................. 430/157; 430/175; 430/270.1; 430/281.1; 430/288.1; 430/302

(58) Field of Classification Search ............ 430/281.1, 430/288.1, 302, 157, 175, 270.1
See application file for complete search history.

(56) References Cited

U.S. PATENT DOCUMENTS

| | | | | |
|---|---|---|---|---|
| 4,751,102 | A | 6/1988 | Adair et al. | 427/53.1 |
| 4,937,159 | A | 6/1990 | Gottschalk et al. | 430/138 |
| 5,204,222 | A | 4/1993 | Gersdorf et al. | 430/281 |
| 5,208,135 | A | 5/1993 | Patel et al. | 430/281 |
| 5,328,803 | A | 7/1994 | Fujikura et al. | 430/281 |
| 5,368,990 | A | 11/1994 | Kawabata et al. | 430/281 |
| 5,800,965 | A | 9/1998 | Tsuji et al. | 430/287.1 |
| 6,238,838 | B1 | 5/2001 | Gaschler et al. | 430/278.1 |
| 6,455,224 | B1 * | 9/2002 | Oohashi et al. | 430/270.1 |
| 6,482,571 | B1 | 11/2002 | Teng | 430/302 |
| 6,511,782 | B1 | 1/2003 | Vermeersch et al. | 430/270.1 |
| 6,548,222 | B2 | 4/2003 | Teng | 430/278.1 |
| 6,576,401 | B2 | 6/2003 | Teng | |
| 7,105,270 | B2 * | 9/2006 | Fujita et al. | 430/270.1 |
| 2002/0025489 | A1 | 2/2002 | Shimada et al. | 430/270.1 |
| 2002/0045128 | A1 | 4/2002 | Nakamura et al. | 430/283.1 |
| 2002/0068240 | A1 | 6/2002 | Teng | 430/280.1 |
| 2002/0068241 | A1 | 6/2002 | Oohashi et al. | 430/288.1 |
| 2002/0155375 | A1 | 10/2002 | Pappas et al. | 430/270.1 |
| 2002/0160295 | A1 | 10/2002 | Aoshima et al. | 430/176 |
| 2002/0172888 | A1 | 11/2002 | Huang et al. | 430/270.1 |
| 2003/0008239 | A1 | 1/2003 | Fujimaki et al. | 430/281.1 |
| 2003/0054288 | A1 | 3/2003 | Shimada et al. | 430/270.1 |
| 2003/0064318 | A1 * | 4/2003 | Huang et al. | 430/270.1 |
| 2003/0068575 | A1 | 4/2003 | Yanaka | 430/270.1 |
| 2003/0075066 | A1 * | 4/2003 | Tan et al. | 101/453 |
| 2003/0129524 | A1 * | 7/2003 | Yanaka | 430/157 |
| 2003/0157433 | A1 | 8/2003 | Timpe et al. | |
| 2003/0162121 | A1 * | 8/2003 | Aoshima | 430/162 |
| 2003/0170559 | A1 * | 9/2003 | Mizutani et al. | 430/270.1 |
| 2003/0190555 | A1 * | 10/2003 | Nagase | 430/302 |
| 2004/0023136 | A1 | 2/2004 | Munnelly et al. | |

FOREIGN PATENT DOCUMENTS

| | | |
|---|---|---|
| EP | 1 117 005 | 7/2001 |
| EP | 1 176 007 | 1/2002 |
| EP | 1 182 033 | 2/2002 |
| EP | 1 186 407 A1 | 3/2002 |
| EP | 1 203 659 | 5/2002 |
| EP | 1 234 662 A2 | 8/2002 |
| EP | 1 235 106 A2 | 8/2002 |
| EP | 1 235 107 | 8/2002 |

OTHER PUBLICATIONS

International Search Report for PCT/US2004/014719, mailed Oct. 27, 2004 (4 pages).

* cited by examiner

*Primary Examiner*—John S. Chu
(74) *Attorney, Agent, or Firm*—J. Lanny Tucker

(57) ABSTRACT

The present invention provides a radiation sensitive composition suitable for us in on-press developable printing plates. The radiation sensitive composition comprises an initiator system including an onium salt and a radiation absorber. The initiator system is combined with a polymerizable material, and a polymeric binder including polyethylene oxide segments.

67 Claims, No Drawings

ON-PRESS DEVELOPABLE IR SENSITIVE PRINTING PLATES CONTAINING AN ONIUM SALT INITIATOR SYSTEM

BACKGROUND OF THE INVENTION

The present invention relates to on-press developable negative-working printing plate precursors, which can be exposed by UV, visible, and infrared radiation. In particular, the present invention relates to on-press developable printing plates precursors having a radiation sensitive layer including an initiator system and polymeric binders containing polyethylene oxide ("PEO") segments.

Lithographic printing plate precursors typically comprise a radiation-sensitive coating applied over the hydrophilic surface of a support. Radiation-sensitive coatings generally include photosensitive components dispersed within an organic polymeric binder. After a portion of the coating is exposed to radiation (commonly referred to as imagewise exposure), the exposed portion becomes either more developable or less developable in a particular liquid than an unexposed portion of the coating. A printing plate precursor is generally considered a negative-working precursor if the exposed portions or areas become less developable in the developer and the unexposed portions or areas are removed in the developing process. After being developed in a suitable liquid, the image area accepts ink, while the revealed regions of the substrate's hydrophilic surface repel ink.

There are several potential ways of improving the properties of radiation sensitive compositions to enhance printing plate performance. One method of improvement involves optimizing the radiation sensitive components in the radiation sensitive layer. For example, a variety of references report the use of initiator systems or complexes that include various combinations of free-radical initiating compounds and radiation absorbing materials. Upon exposure of the radiation sensitive layer to radiation, the radiation absorbing compound absorbs the radiation and releases heat energy. The free-radical initiating compound promotes polymerization or hardening of a polymerizable material to produce an image area.

For example, U.S. Published Application No. 2002/0025489 to Shimada et al. reports a heat-sensitive composition including a compound that generates an acid or radical when heated (e.g. an onium salt) and a compound whose physical properties are irreversibly changed by an acid or radical. The composition may further include an IR dye. U.S. Published Application No. 2003/0054288 to Shimada et al. reports a heat sensitive composition including a cationic onium salt, a compound having a polymerizable unsaturated group and a light-heat converting agent such as an IR dye. U.S. Published Application No. 2003/0068575 reports a photosensitive layer for a printing plate including an IR absorbing agent, an onium salt, a radically polymerizable compound, a polymeric binder and an organic dye.

Additionally, U.S. Pat. No. 4,751,102 to Adair et al. and U.S. Pat. No. 4,937,159 to Gottschalk et al. report photohardenable compositions including a free-radical polymerizable or crosslinkable compound and an ionic dye-counter ion compound capable of absorbing radiation and producing free radicals to initiate polymerization or cross-linking of the polymerizable or crosslinkable compound. U.S. Pat. No. 5,368,990 to Kawabata et al. reports a photopolymerizable composition comprising an addition polymerization compound and a photopolymerization initiating compound including a specific anionic dye and a diaryliodonium salt as a polymerization initiator. U.S. Pat. No. 5,208,135 to Patel et al. reports an anionic photosensitive dye, an iodonium salt and a free-radical curable resin.

More recently, it has been determined that initiator systems or complexes may be utilized in "processless" or "on-press developable" printing plates. As used herein, the terms "processless" and/or "on-press developable" refers to printing plate precursors that do not require one or more conventional processing steps (e.g. development) prior to mounting on a printing press. For example, U.S. Pat. Nos. 6,482,571 and 6,548,222 to Teng report on-press developable printing plates having a thermosensitive layer including a free radical initiator, a radiation absorbing material and a polymerizable monomer.

Despite the recent advances in processless printing plates, it would be beneficial to prepare a processless printing plate precursor incorporating an initiator system that promotes improved manufacturing efficiency, including faster imaging speeds and improved handling and evaluation characteristics (e.g visible printout), as well as substantially increased durability and run lengths on-press.

SUMMARY OF THE INVENTION

In one embodiment, the present invention provides a radiation sensitive composition including an initiator system or complex that includes an onium salt and an IR radiation absorber, combined with a polymeric binder including polyethylene oxide ("PEO") segments, and a polymerizable material.

Suitable onium salts may include, for example, sulfonium salts, oxysulphoxonium salts, oxysulphonium salts, sulphoxonium salts, ammonium salts, selenonium salts, arsonium salts, phosphonium salts, diazonium salts, and/or halonium salts such as iodonium salts. In one embodiment, the onium salt is an iodonium salt.

Suitable IR radiation absorbers include IR radiation absorbers that have an anionic chromophore. As used herein the term "anionic chromophore" refers to chromophores having at least one anionic group and an overall negative charge. In one embodiment, the IR radiation absorber includes an IR dye. Suitable IR dyes generally include azo dyes, squarilium dyes, croconate dyes, triarylamine dyes, thiazolium dyes, indolium dyes, oxonol dyes, oxaxolium dyes, cyanine dyes, merocyanine dyes, indocyanine dyes, indotricarbocyanine dyes, oxatricarbocyanine dyes, phthalocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bis(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, and porphyrin dyes. IR dyes having an anionic chromophore may be particularly suitable for use in embodiments of the present invention.

Suitable polymerizable materials for use in the radiation sensitive composition of the present invention include addition polymerizable ethylenically unsaturated groups, crosslinkable ethylenically unsaturated groups, ring-opening polymerizable groups, azido groups, aryldiazonium salt groups, aryldiazosulfonate groups or combinations thereof.

Suitable polymeric binders having PEO segments may include copolymers, such as graft copolymers having a main chain polymer and PEO side chains, block copolymers having PEO blocks and non-PEO block, or combinations of these graft and block copolymers.

Radiation sensitive compositions formed according to embodiments of the present invention may be soluble and/or dispersible in water and other aqueous solutions. More particularly, the radiation sensitive compositions may be soluble and/or dispersible in fountain solutions and or inks commonly used in lithographic printing presses.

In another embodiment, the present invention provides an imageable element including a substrate and a radiation sensitive layer. The radiation sensitive layer includes an initiator system including an onium salt and an IR radiation absorber, a polymerizable material, and a polymeric binder including PEO segments. Suitable substrates for this embodiment include aluminum substrates that may be grained, anodized and/or post-treated with, for example, polyacrylic acid to form an interlayer. The radiation sensitive layer may be developable in water, as well as in fountain solutions and/or inks.

In a further embodiment, the present invention provides an imageable element including a substrate and a radiation sensitive layer including an initiator system including a UV radiation sensitive onium salt, a polymerizable material and a polymeric binder including PEO segments. This embodiment may be particularly suitable for imaging with UV radiation.

In yet another embodiment, the present invention provides a method for making a printing plate precursor, in which the initiator system, the polymerizable material, and the polymeric binder described herein are combined with a suitable carrier to form a coating mixture. The coating mixture is applied onto a substrate and is then dried to form a radiation sensitive layer. The radiation sensitive layer may then be imagewise exposed to IR radiation to form an imaged printing plate precursor, in which exposed portions of the radiation sensitive layer are less developable in a suitable developing liquid (e.g. water, fountain solution and/or ink) than unexposed portions of the radiation sensitive layer. The imaged printing plate precursor may then be developed on-press using aqueous fountain solutions and/or ink.

The present invention provides several benefits over prior printing plates. First, printing plate precursors of the present invention may be imaged at faster imaging speeds that many on-press developable printing plates, which may result in increased throughput and improved overall manufacturing efficiency. Second, printing plate precursors formed according to the present invention may be developed on-press without requiring a separate development step. Third, printing plates formed according to embodiment of the present invention possess substantially improved run lengths and durability as compared to plates that do not include the radiation sensitive layer of the present invention. Fourth, image areas on the printing plate are visually distinguishable from non-imaged areas, which may provide for improved off-press and/or pre-press handling and evaluation of the printing plates.

DETAILED DESCRIPTION OF THE INVENTION

The radiation sensitive composition of the present invention includes an initiator system combined with a polymerizable material and a polymeric binder including PEO groups or segments.

The initiator system used in the radiation sensitive composition of the present invention may include a suitable onium salt. Suitable onium salts include, sulfonium salts, oxysulphoxonium salts, oxysulphonium salts, sulphoxonium salts, ammonium salts, selenonium salts, arsonium salts, phosphonium salts, diazonium salts, and/or halonium salts such as iodonium salts.

Suitable phosphonium salts include positively-charged hypervalent phosphorus atoms with four organic substituents. Suitable sulfonium salts such as triphenylsulfonium salts may have a positively-charged hypervalent sulfur with three organic substituents. Suitable diazonium salts may possess a positively-charged azo group (i.e., $-N{=}N^+$). Suitable ammonium salts include a positively charged nitrogen atom such as substituted quaternary ammonium salts with four organic substituents, and N-alkoxypyridinium salts. Suitable iodonium salts, for example diaryliodonium ($Ar^1-I^+-Ar^2$; Ar=aryl group) salts such as diphenyliodonium salts, may have positively-charged hypervalent iodine atoms with two organic substituents.

Specific examples of suitable onium salts may include diphenyl iodonium chloride, diphenyl iodonium hexafluorophosphate, diphenyl iodonium hexafluoroantimonate, diphenyl iodonium octyl sulfate, diphenyl iodonium octyl thiosulfate, diphenyl iodonium-2-carboxylate, 4,4'-dicumyl iodonium chloride, 4,4'-dicumyl iodonium hexafluorophosphate, 4,4'-dicumyl iodonium p-tolyl sulfate, [4-[(2-Hydroxytetradecyl-oxy]-phenyl]phenyliodonium hexafluroantimonate, N-methoxy-α-picinolinium-p-toluene sulfonate, 4-methoxybenzene-diazonium tetrafluoroborate, 4,4'-bis-dodecylphenyl iodonium-hexafluorophosphate, 2-cyanoethyl-triphenylphosphonium chloride, bis-[4-diphenylsulfoniumphenyl]sulfide-bis-hexafluorophosphate, bis-4-dodecylphenyliodonium hexafluoroantimonate, triphenyl sulfonium hexafluoroantimonate, triphenyl sulfonium tetrafluoroborate, triphenyl sulfonium octyl sulfate, 2-methoxy-4-(phenylamino)-benzenediazonium hexadecyl sulfate, 2-methoxy-4-(phenylamino)-benzenediazonium vinyl benzyl thiosulfate, 2-methoxy-4-(phenylamino)-benzenediazonium octyl sulfate, 2-methoxy-4-aminophenyl diazonium hexafluorophosphate, phenoxyphenyl diazonium hexafluoroantimonate, and anilinophenyl diazonium hexafluoroantimonate.

Additional onium salts that may be suitable for use in embodiments of the present invention are reported in U.S. Pat. No. 5,086,086 to Brown-Wensley, et al., U.S. Pat. No. 5,965,319 to Kobayashi, U.S. Pat. No. 6,051,366 to Baumann, et al and U.S. Published Patent Application No. 2002/0068241 A1 to Oohashi et al, incorporated herein by reference for the purpose of providing examples of suitable onium salts in accordance with the present invention.

Iodonium salts may be particularly suitable for use in embodiments of the present invention. In one embodiment, for example, the onium salt is a positively charged iodonium, (4-methylphenyl)[4-(2-methylpropyl)phenyl]-moiety having a suitable negatively charged counter-ion. A specific example of this salt is Irgacure 250 available from Ciba Specialty Chemicals, Tarrytown, N.Y. The chemical formula for Irgacure 250 is iodonium, (4-methylphenyl)[4-(2-methylpropyl)phenyl],-hexafluorophosphate, which is supplied in a 75 w/w % propylene carbonate solution.

Suitable radiation absorbers for use in the initiator system of the present invention may include IR radiation absorbers that absorb radiation at between about 600 and about 1200 nm. Suitable IR radiation absorbers may have an anionic chromophore.

In one embodiment, the radiation absorber includes an IR dye, more particularly, an IR dye having an anionic chromophore. Examples of suitable IR dyes may include azo dyes, squarilium dyes, croconate dyes, triarylamine dyes, thiazolium dyes, indolium dyes, oxonol dyes, oxaxolium dyes, cyanine dyes, merocyanine dyes, indocyanine dyes, indotricarbocyanine dyes, oxatricarbocyanine dyes, phthalocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and his (chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, a substituted form of any of the preceding, or an ionic form of any of the preceding. Suitable dyes are also disclosed in U.S. Pat. No. 5,208,135 to Patel et al., which is incorporated herein by reference.

Cyanine dyes having an anionic chromophore may be particularly suitable for use in embodiments of the present invention. In one embodiment, the cyanine dye may contain a chromophore having two heterocyclic groups. In another embodiment, the cyanine dye may have at least two sulphonic acid groups, more particularly at least two sulphonic acid groups and two indolenine groups. Mixtures of cyanine dyes may also be suitable. A general example of suitable cyanine dye is represented by the formula shown below:

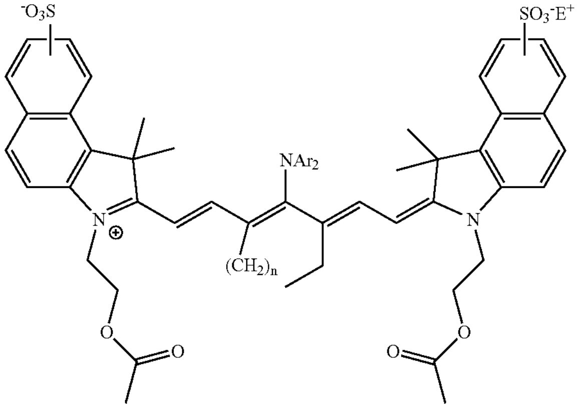

wherein Ar is a substituted or unsubstituted aryl, E is a positively charged counter-ion and n=1 or 2 (to form a five or six carbon atom ring).

In one embodiment, the IR dye is represented by the formula:

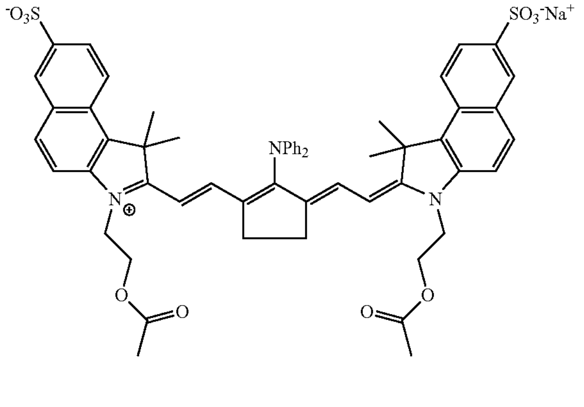

Near-infrared-absorbing cyanine dyes are also disclosed, for example, in U.S. Pat. No. 6,309,792 to Hauck, et al., U.S. Pat. No. 6,264,920 to Achilefu, et al., U.S. Pat. No. 6,153,356 to Urano, et al., and U.S. Pat. No. 5,496,903 to Watanabe, et al. Suitable dyes may be formed by conventional methods, and/or may be obtained from, for example, American Dye Source, Baie D'Urfe, Quebec, Canada and FEW Chemicals, Germany. The concentration of the radiation absorber in a dry film may be in a range of between about 0.05 and about 20 w/w percent, more particularly between about 0.1 and about 5 w/w percent.

The radiation sensitive composition may also be sensitive to UV radiation. In one embodiment, one or more components of the initiator system, for example, the onium salt, is UV sensitive. In another embodiment, an additional UV radiation absorber may be added to the radiation sensitive composition. In UV sensitive embodiments of the present invention, an IR radiation absorber is not required, but may be included if desired.

The initiator system reported herein may affect the solubility of the radiation sensitive layer in suitable developers upon exposure to radiation. More particularly, upon radiation exposure, the onium salt may cause or induce polymerization of the polymerizable material. This polymerization may be further enhanced by the presence of the radiation absorber, which may absorb radiation to produce heat energy. Initiator systems including an onium salt and an IR radiation absorber as reported herein, may optimize this polymerization process to more efficiently produce a highly durable printing plate.

Suitable polymerizable materials for use in the radiation sensitive composition of the present invention include addition polymerizable ethylenically unsaturated groups, crosslinkable ethylenically unsaturated groups, ring-opening polymerizable groups, azido groups, aryldiazonium salt groups, aryldiazosulfonate groups or combinations thereof. Suitable polymerizable materials may also be reported in U.S. Published Patent Application No. 2003/0064318, incorporated herein by reference.

Suitable addition polymerizable ethylenically unsaturated groups may be polymerizable by free radical polymerization, cationic polymerization, or combinations thereof. Suitable free radical addition polymerizable ethylenically unsaturated groups may include methacrylate groups, acrylate groups, or combinations thereof. Suitable cationic polymerizable ethylenically unsaturated groups may include a vinyl ether, an aryl substituted vinyl compound (including styrene and alkoxy styrene derivatives), or combinations thereof. Suitable crosslinkable ethylenically unsaturated groups may include a dimethylmaleimide group, a chalcone group, or a cinnamate group. Suitable ring-opening polymerizable groups may include an epoxide, an oxetane, or combinations thereof.

In one embodiment, the polymerizable material used in the present invention includes an acrylate moiety, a methacrylate moiety or combinations thereof. In another embodiment, the polymerizable material includes a urethane acrylate, a urethane (meth)acrylate or combinations thereof. For example, the polymerizable material may include a urethane acrylate monomer prepared by reacting Desmodur 100, an aliphatic polyisocyanate resin based on hexamethylene diisocyanate (available from Bayer Corp., Milford, Conn.) with hydroxy acrylate and pentaerythritol.

The polymerizable material of the invention may be included in a sufficient amount to render radiation exposed portions of the radiation sensitive layer substantially insoluble in aqueous solutions or developers, for example, in fountain solution and/or ink. The weight ratio of polymerizable material to polymeric binder may range from about 5:95 to about 95:5, particularly from about 10:90 to about 90:10, more particularly from about 20:80 to about 80:20, and even more particularly from about 30:70 to about 70:30.

Suitable polymeric binders used in the radiation sensitive layer of the present invention include polymers having PEO segments, and may include the polymers reported in U.S. Published Patent Application No. 2003/0064318, incorporated herein by reference. In one embodiment, the polymeric binder of the present invention may include a graft copolymer having a main chain polymer and PEO side chains.

The term "graft" polymer or copolymer in the context of the present invention refers to a polymer which has as a side chain a group having a molecular weight of at least 200. Such graft copolymers may be obtained, for example, by anionic, cationic, non-ionic, or free radical grafting methods, or may be obtained by polymerizing or co-polymerizing monomers that contain such groups. The term "polymer" in the context of the present invention refers to high and low molecular weight polymers, including oligomers, and includes homopolymers and copolymers. The term "copolymer" refers to polymers that are derived from two or more different monomers or oligomers. The term "backbone" in the context of the present invention refers to the chain of atoms in a polymer to which a plurality of pendant groups are attached.

The graft copolymer may be amphiphilic (i.e. may comprise both hydrophilic and hydrophobic segments). Such amphiphilic copolymers may also tend to be surface active. The PEO segments are hydrophilic. The combination of hydrophobic and hydrophilic segments may enhance differentiation of the exposed and unexposed areas.

The glass transition temperature $T_g$ of the graft copolymer used in embodiments of the present invention may range from about 35 to about 220° C., more particularly from about 45 to about 140° C., even more particularly from about 50 to about 130° C. The polymeric binder having $T_g$ values in the range specified above may be a solid that is non-elastomeric and not cross-linked. The glass transition temperature $T_g$ of the main chain polymer of the graft copolymer may range from between about 40 to about 220° C., more particularly from about 50 to about 140° C., even more particularly from about 60 to about 130° C.

The graft copolymer may have number average molecular weights from about 2,000 to about 2,000,000. The number average molecular weight (Mn) of the PEO segments may range from about 500 to about 10,000, more particularly from about 600 to about 8,000, even more particularly from about 750 to about 4,000. When the Mn values are less than about 500, there may be insufficient hydrophilic segments to adequately promote aqueous developability. However, ink receptivity of the image areas tends to decrease with increasing Mn values of the PEO segments approaching and/or exceeding 10,000. The amount of PEO segments in the graft copolymers may range from about 0.5 to about 60% by weight, more particularly from about 2 to about 50% by weight, and even more particularly from about 5 to about 40% by weight.

In one embodiment, the graft copolymer may have a hydrophobic polymer backbone and a plurality of pendant groups represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is hydrophobic, Y is a hydrophilic segment.

In another embodiment, the graft copolymer may comprises repeating units where each unit is represented by the formula:

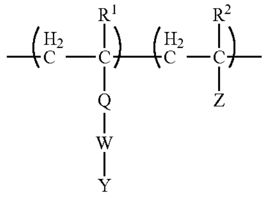

wherein each of $R^1$ and $R^2$ is independently hydrogen, alkyl, aryl, aralkyl, alkaryl, $COOR^5$, $R^6CO$, halogen or cyano, and wherein each of $R^5$ and $R^6$ is independently alkyl aryl, aralkyl or alkaryl;

Q is:

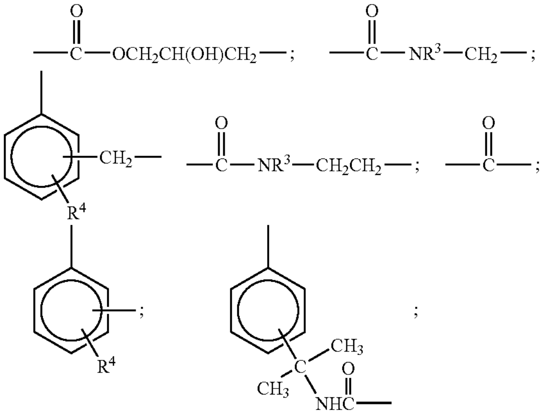

wherein $R^3$ is hydrogen or alkyl; $R^4$ is hydrogen, alkyl, halogen, cyano, nitro, alkoxy, alkoxycarbonyl, acyl or a combination thereof;

W is a hydrophilic segment or a hydrophobic segment;

Y is a hydrophilic segment or a hydrophobic segment;

Z is hydrogen, alkyl, halogen, cyano, acyloxy, alkoxy, alkoxycarbonyl, hydroxyalkyloxycarbonyl, acyl, aminocarbonyl, aryl or substituted aryl; with the proviso that when W is a hydrophilic segment, Y is a hydrophilic segment or a hydrophobic segment, with the further proviso that when W is hydrophobic, Y is a hydrophilic segment.

In one embodiment, the graft copolymer of the present invention includes main chain segments that are predominately hydrophobic and branch segments that are predominately hydrophilic. In another embodiment, the graft copolymer includes main chain segments that are predominately hydrophobic and branch segments including both hydrophobic and hydrophilic segments.

The hydrophilic segment in W in the graft copolymer of the present invention may be a segment represented by the formula:

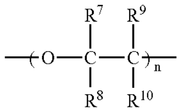
or
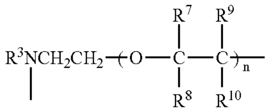

wherein each of $R^7$, $R^8$, $R^9$ and $R^{10}$ is hydrogen; $R^3$ is hydrogen or alkyl; and n is from about 12 to about 250. The hydrophobic segment in W is $—R^{12}—$, $—O—R^{12}—O—$, $—R^3N—R^{12}—NR^3$, $—OOC—R^{12}—O—$ or $—OOC—R^{12}—O—$, wherein each $R^{12}$ can independently be a linear, branched or cyclic alkylene of 6-120 carbon atoms, a haloalkylene of 6-120 carbon atoms, an arylene of 6-120 carbon atoms, an alkarylene of 6-120 carbon atoms or an aralkylene of 6-120 carbon atoms; and $R^3$ is hydrogen or alkyl.

The hydrophilic segment in Y can be hydrogen, $R^{15}$, OH, $OR^{16}$, COOH, $COOR^{16}$, $O_2CR^{16}$, a segment represented by the formula:

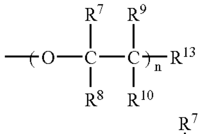

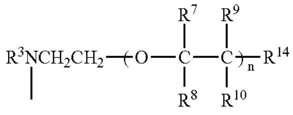

wherein each of $R^7$, $R^8$, $R^9$ and $R^{10}$ is hydrogen; $R^3$ is hydrogen or alkyl; wherein each of $R^{13}$, $R^{14}$, $R^{15}$ and $R^{16}$ is independently hydrogen or an alkyl of 1-5 carbon atoms and n is from about 12 to about 250. The hydrophobic segment in Y can be a linear, branched or cyclic alkyl of 6-120 carbon atoms, a haloalkyl of 6-120 carbon atoms, an aryl of 6-120 carbon atoms, an alkaryl of 6-120 carbon atoms, an aralkyl of 6-120 carbon atoms, $OR^{17}$, $COOR^{17}$ or $O_2CR^{17}$, wherein $R^{17}$ is an alkyl of 6-20 carbon atoms.

In another embodiment, the segment W—Y is represented by the formula:

$$—(OCH_2CH_2)_n—OCH_3$$

wherein n is from about 12 to about 75. In this embodiment, the graft copolymer has, for example, repeating units represented by the formula:

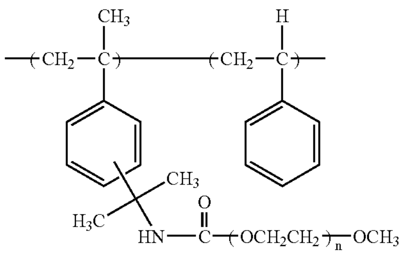

wherein n is from about 12 to about 75. More particularly, n has an average value of about 45.

In yet another embodiment, the graft copolymer comprises repeating units represented by the formula:

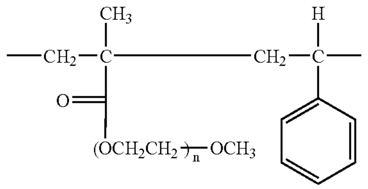

wherein n is from about 12 to about 75, more preferably, n has an average value of about 45.

In a further embodiment, the main chain polymer of the graft copolymer of the invention comprises monomer units including acrylate esters, methacrylate esters, styrene, acrylic acid, methacrylic acid, or combinations thereof. More particularly, the monomer units are methyl methacrylate, allyl methacrylate, or combinations thereof.

The graft copolymer having hydrophobic and/or hydrophilic segments may be prepared by a process including the steps of:

(A) contacting the following components to produce a polymerizable graft copolymer:

(i) a compound represented by the formula:

W'—Y' wherein W' is a hydrophilic segment or a hydrophobic segment and Y' is a hydrophilic segment or a hydrophobic segment, with the proviso that when W' is a hydrophilic segment, Y' is a hydrophilic segment or a hydrophobic segment, with the further proviso that when W' is hydrophobic, Y' is a hydrophilic segment, and (ii) a polymerizable material selected from compounds represented by the formula:

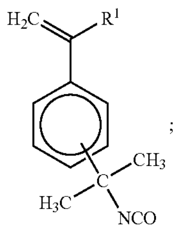
;
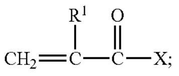
and
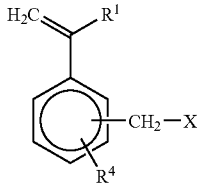

wherein each $R^1$ is hydrogen, alkyl, aryl, aralkyl, alkaryl, $COOR^5$, $R^6CO$, halogen or cyano, wherein each of $R^5$ and $R^6$ is independently alkyl, aryl, aralkyl or alkaryl; $R^4$ is hydrogen, alkyl, halogen, cyano, nitro, alkoxy, alkoxycarbonyl, acyl or a combination thereof; and X is glycidyloxy or a leaving group selected from halogen, alkoxy or aryloxy, to produce a polymerizable graft monomer; and (B) copolymerizing the polymerizable graft monomer and one or more comonomers at a temperature and for a period of time sufficient to produce the graft copolymer. When necessary, the contacting step takes place in the presence of a catalyst.

The comonomer may be styrene, substituted styrene, alpha-methylstyrene, acrylate ester, methacrylate ester, acrylonitrile, acrylamide, methacrylamide, vinyl halide, vinyl ester, vinyl ether and an alpha-olefin.

The polymerizable monomer may be any monomer that is capable of reacting with W'—Y' and includes polymerizable monomers such as m-isopropenyl-α, α-dimethylbenzyl isocyanate, acryloyl chloride and methacryloyl chloride. The reaction is typically carried out in the presence of a catalyst, which may be a base, a tin compound or a mixture thereof. In a reaction that includes an acid catalyst, an acid catalyst such as a Lewis or protic acid may be used.

The compounds represented by the formula W'—Y' may be one or more of compounds represented by the formula:

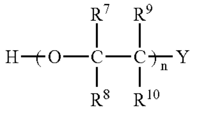

and

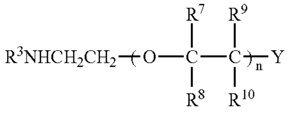

wherein each of $R^7$, $R^8$, $R^9$ and $R^{10}$ is hydrogen; $R^3$ is hydrogen or alkyl; Y is alkyl, acyloxy, alkoxy or carboxylate; and n is from about 12 to about 250.

The graft copolymer may be obtained by a free-radical copolymerization of the graft monomer and the comonomer, particularly at a comonomer to graft monomer weight ratio of from about 99:1 to about 45:55.

Alternatively, the graft copolymer may be prepared by first copolymerizing a polymerizable monomer according to the present invention with one or more comonomers at a temperature and for a period of time sufficient to produce a graftable copolymer and thereafter grafting the group W'—Y' onto the graftable copolymer. Such grafting can be achieved by contacting in the presence of a catalyst the above graftable copolymer and a compound represented by the formula:

W'—Y' wherein W' is a hydrophilic segment or a hydrophobic segment and Y' is a hydrophilic segment or a hydrophobic segment, with the proviso that when W' is a hydrophilic segment, Y' is either a hydrophilic segment or a hydrophobic segment, with the further proviso that when W' is hydrophobic, Y' is a hydrophilic segment.

The graft copolymers of the present invention may be prepared by reacting hydroxy-functional or amine functional polyethylene glycol monoalkyl ethers with polymers having co-reactive groups, including acid chloride, isocyanate and anhydride groups. The side chains may further comprise a hydrophobic segment between the PEO segment and the main chain, and a hydrophobic segment at the terminus of the PEO side chains. Other methods of preparation of the graft copolymers of the present invention include the methods described in U.S. Published Patent Application Nos. 2002/0155375 and 2002/0172888, both incorporated herein by reference.

The main chain polymer of the graft copolymers may be an addition polymer or a condensation polymer. Addition polymers may be prepared from acrylate and methacrylate esters, acrylic and methacrylic acid, acrylamides and methacrylamides, acrylonitrile and methacrylonitrile, styrene, vinyl phenol and combinations thereof. Addition polymers may also be prepared from styrene, methylmethacrylate, allyl acrylate and methacrylate, acrylic and methacrylic acid, and combinations thereof. Condensation polymers may include polyurethanes, epoxy resins, polyesters, polyamides and phenolic polymers, including phenol/formaldehyde and pyrogallol/acetone polymers. Suitable mixtures of graft copolymers may each include a main chain polymer and PEO side chains.

In an alternate embodiment, the polymeric binder includes a block copolymer having PEO blocks and non-PEO blocks. The block copolymers of the present invention may be formed by conventional procedures, including anionic, cationic, and free radical polymerization. Atom transfer radical polymerization (ATRP) and reversible addition-fragmentation chain transfer (RAFT) polymerization may be particularly suitable methods. PEO block copolymers may also be prepared by ATRP methods, as reported by M. Ranger, et al., "*From well-defined diblock copolymers prepared by a versatile atom transfer radical polymerization method to supramolecular assemblies,*" Journal of Polymer Science, Part A: Polymer Chemistry, Vol. 39 (2001), pp. 3861-74.

The block copolymers may have number average molecular weights from about 2,000 to about 2,000,000. The number average molecular weight (Mn) of the PEO segments may range from about 500 to about 10,000, more particularly from about 600 to about 8,000, even more particularly from about 750 to about 4,000. The amount of PEO segments in the block copolymers may range from about 5 to about 60% by weight, more particularly from about 10 to about 50% by weight, even more particularly from about 10 to about 30% by weight.

The non-PEO blocks of the block copolymers may be an addition block polymer or a condensation block polymer. The addition block polymers include homopolymers or copolymers of monomers selected from acrylate and methacrylate esters, including allyl acrylate and methacrylate, acrylic and methacrylic acid, acrylamides and methacrylamides, acrylonitrile and methacrylonitrile, styrene, and vinyl phenol. Suitable condensation block polymers include polyurethanes, epoxy resins, polyesters, polyamides and polyureas.

In one embodiment of the invention, the non-PEO block of the block copolymers is free of polyalkylene oxide segments. In another embodiment, the non-PEO block includes homopolymers or copolymers of monomers such as methyl methacrylate, allyl acrylate and methacrylate, acrylic and methacrylic acid, styrene, vinyl phenol and combinations thereof.

The block copolymer included in embodiments of the present invention may include a mixture of block copolymers each containing at least one PEO block and at least one non-PEO block. Alternatively, the polymeric binder may include a mixture of the graft and block copolymers reported herein.

The polymeric binder may be present in sufficient amounts to render the radiation sensitive layer soluble or dispersible in an aqueous developer. The amount of polymeric binder may range from about 10% to about 90% by dry weight of the composition, more particularly from about 30% to about 70% by dry weight.

Optionally, the radiation sensitive composition may include discrete particles. For example, the particles may include a mixture of copolymers, which contain various possible combinations of monomeric units. Additionally, the discrete particles may be particles of the polymeric binder which are suspended in the polymerizable material. The major dimension of the particles in the suspension may range between about 60 nm and about 300 nm in diameter.

The presence of such discrete particles may promote developability of the areas that are not exposed to radiation.

The radiation sensitive composition may also include a variety of additives including dispersing agents, humectants, biocides, plasticizers, surfactants, viscosity builders, colorants, pH adjusters, drying agents, defoamers, preservatives, antioxidants, development aids, rheology modifiers or combinations thereof. In one embodiment, the radiation sensitive composition includes a mercaptan derivative, for example, a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4-triazole, 3-mercapto-1, 5-diphenyl-1,2,4-triazole and 5-(p-aminophenyl)-3-mercapto-1,2,4-triazole. Various mercaptobenzimidazoles, mercaptobenzthiazoles, and mercaptobenzoxazoles may also be suitable. In another embodiment, the radiation absorber includes a viscosity builder such as hydroxypropyl cellulose, hydroxyethyl cellulose, carboxymethyl cellulose and polyvinyl pyrrolidones.

Suitable substrates for the present invention may vary widely depending upon the desired Application and the specific composition employed. The substrate may be of sufficient thickness to sustain the wear from printing or other desired Applications, and may be thin enough to wrap around a printing form, typically having a thickness from about 100 to about 600 μm. Suitable substrates or substrate surfaces may be hydrophilic, and may be composed of metals, polymers, ceramics, stiff papers, or laminates or composites of these materials. Suitable metal substrates include aluminum, zinc, titanium and alloys thereof.

In one embodiment, the substrate includes aluminum, which may be subjected to one or more treatment steps. For example, the aluminum substrate may be grained, such as by brush graining, quartz graining or electrolytic graining. The aluminum substrate may also be anodized by the Application of a current in the presence of sulfuric or phosphoric acid. Additionally, the aluminum substrate may be post-treated to form an interlayer on the aluminum surface. Suitable materials for the interlayer treatment include polyacrylic acid, polyvinyl phosphonic acid, sodium dihydrogen phosphate/sodium fluoride and vinyl phosphonic acid/acrylamide copolymer.

In one embodiment, the substrate is an aluminum substrate that is brush grained, anodized with phosphoric acid, and is then post-treated with polyacrylic acid to form an interlayer.

Substrates that are anodized with phosphoric acid may provide benefits over sulfuric acid-anodized substrates because anodic pore size resulting from sulfuric acid anodization is typically less than 20 nm whereas anodic pore size resulting from phosphoric acid anodization is typically greater than 30 nm. Other conventional anodization methods may also be used in the preparation of the anodized substrate of the present invention, including methods that produce an anodic pore size larger than the anodic pore size produced by sulfuric acid anodization.

The radiation sensitive compositions reported herein are generally applied to the substrate as a coating mixture. Suitable carriers for the coating mixture may include both organic and aqueous liquids. More particularly, suitable carriers may include aqueous carriers and mixtures of water miscible organic liquids in aqueous carriers. A wide range of water miscible liquids may be used in the carrier of the present invention. Examples of suitable water miscible organic liquids include alcohols and ketones.

Suitable amounts of the polymeric binder, the polymerizable material, the initiator system and optional additives may be combined with the carrier to form the coating mixture. In one embodiment, a graft copolymer according to embodiments of the present invention is first dispersed in an organic water miscible organic liquid such as n-propanol or methyl ethyl ketone, and is then combined with the coating mixture.

The coating mixture may be applied to the surface of a suitable substrate by conventional methods, such as by spin coating, bar coating, gravure coating, knife coating or roller coating. The coating mixture may then be air dried, oven dried or radiation cured to form a radiation sensitive layer. This drying step may remove and/or evaporate portions of the carrier and/or certain optional components, such as the dispersing agent. The dry weight of the radiation sensitive layer may range from about 0.2 to about 5 $g/cm^2$, more particularly from about 0.7 to about 2.5 $g/cm^2$.

Optionally, the resulting printing plate precursor may further include an overlying layer. The overlying layer may serve as an oxygen barrier layer by including an oxygen-impermeable compound. The term "oxygen-impermeable compound" refers to a compound that prevents the diffusion of oxygen from the atmosphere into the layer during the lifetime of the radicals generated by IR exposure. The overlying layer may also prevent damage, such as scratching, of the surface layer during handling prior to imagewise exposure, damage to the surface of the imagewise exposed areas, for example, by over-exposure which could result in partial ablation, and/or to facilitate developability of the unexposed areas.

Optionally, the imageable element may also include an underlying layer. The underlying layer may enhance developability of the imagewise unexposed areas and/or act as a thermal insulating layer for the imagewise exposed areas. Such a thermal insulating polymeric layer may prevent otherwise rapid heat dissipation, for example, through the heat conducting aluminum substrate. This may allow for more efficient thermal imaging throughout the radiation sensitive layer, particularly in the lower sections of the radiation sensitive layer. In accordance with these functions, the underlying layer may be soluble or dispersible in the developer and may have a relatively low thermal conductivity coefficient.

The resulting printing plate precursor may be imagewise exposed to radiation, for example IR radiation, such that exposed portions of the radiation sensitive layer have a lower developability in suitable developers than unexposed portions. An example of a suitable radiation source is the Creo Trendsetter 3230, which contains a laser diode that emits near infrared radiation at a wavelength of about 830 nm and is available from Creo Products Inc., Burnaby, BC, Canada. Other suitable radiation sources include the Crescent 42T Platesetter, an internal drum platesetter that operates at a wavelength of 1064 nm (Gerber Scientific, South Windsor, Conn., USA), and the Screen PlatRite 4300 series or 8600 series (Screen, Chicago, Ill.). Additional useful radiation sources include direct imaging presses, which are able to image a plate while attached to a printing press cylinder. An example of a suitable direct imaging printing press includes the Heidelberg SM74-DI press, available from Heidelberg, Dayton, Ohio. In one embodiment, imagewise exposure may be performed with radiation in the range of about 300 to about 1200 nm, more particularly from about 600 to about 1200 nm. Imaging speeds for embodiments of the present invention may be in the range of between about 50 and about 1500 $mJ/cm^2$, more particularly between about 75 and about 400 $mJ/cm^2$, and even more particularly between about 150 and about 300 $mJ/cm^2$.

After imaging, the unexposed portions of the printing plate precursor may be removed by contacting the portions with a suitable developer. Suitable developers may be acidic, neutral or alkaline in nature, and may include both aqueous liquids, organic liquids and mixtures thereof.

Advantageously, the imaged printing plate precursor may be mounted in a printing press without first being subjected to a separate processing step using alkaline developers. Instead, the imaged printing plate precursor may be developed "on press" by the fountain solution and/or ink used in conventional printing presses. Alternatively, in embodiments that utilize direct imaging presses, the printing plate precursor may be mounted on the direct image press, and may then be exposed to infrared radiation and developed on-press.

Suitable fountain solutions for developing the imaged printing plate precursor include substantially aqueous solvents, but may also include water miscible organic liquids such as suitable alcohols and alcohol replacements. Specific examples of suitable fountain solutions include mixtures of the following materials in water:

Varn Litho Etch 142W+Varn PAR (alcohol sub) @ 3 oz/gal $H_2O$ each (Varn International, Addison, Ill.);

Varn Crystal 2500 (1-step) @ 4.5 oz/gal $H_2O$ (Varn International);

Varn Total Chromefree (@ 3.2 oz/gal $H_2O$) (Varn International)+Anchor ARS-F (@ 1.2 oz/gal $H_2O$) (Anchor, Orange Park, Fla.);

Anchor Emerald JRZ (3 oz/gal $H_2O$)+Anchor ARS-ML (3.5 oz/gal $H_2O$) (Anchor);

Rosos Plain KSP (@ 3-4 oz/gal $H_2O$)+Varn PAR @ 3 oz/gal $H_2O$ each (Rosos Research Laboratories, Inc.);

Rosos KSP 500 (@ 5 oz/gal $H_2O$)+RV1000 (@ 4 oz/gal $H_2O$) (Rosos Research Laboratories, Inc.);

Prisco 3451U (@ 4 oz/gal $H_2O$)+Alkaless 3000 (@ 3 oz/gal $H_2O$) (Prisco, Newark, N.J.);

Prisco 4451 FK (@ 3 oz/gal $H_2O$)+Alkaless 6000 (@ 2 oz/gal $H_2O$) (Prisco);

Prisco Webfount 300 (@ 2 oz/gal $H_2O$)+Alkaless 6000 (@ 3 oz/gal $H_2O$) (Prisco);

Rycoline Green Diamond 251TW (@ 3 oz/gal $H_2O$)+ Rycoline Green Diamond alcohol replacer (@ 2 oz/gal $H_2O$) (Rycoline, Chicago, Ill.);

Allied PressControl EWS (@ 5 oz/gal $H_2O$)+HydroPlus (@ 1.5 oz/gal $H_2O$) (Allied Pressroom Chemistry, Hollywood, Fla.);

RBP 910H (@ 3 oz/gal $H_2O$)+Aquanol 600 (@2 oz/gal $H_2O$) (RBP Chemical Technology, Milwaukee, Wis.);

Allied Compliance ES (@ 3 oz/gal $H_2O$)+HydroDyne (@ 3 oz/gal $H_2O$) (Allied Pressroom Chemicals);

Alternatively, the precursor may be developed using conventional aqueous developer compositions. Common components of conventional aqueous developers include surfactants, chelating agents, such as salts of ethylenediamine tetraacetic acid, organic solvents, such as benzyl alcohol and phenoxyethanol, and alkaline components such as inorganic metasilicates, organic metasilicates, hydroxides and bicarbonates. The pH of the aqueous developer is preferably within about 5 to about 14, depending on the nature of the radiation sensitive composition.

The unexposed areas of the radiation sensitive layer are removed after being contacted with fountain solution and/or ink as part of the normal printing process, while exposed areas remain adhered to the support to form an ink receptive image area.

Prior to the imaging step, the precursor may be subjected to one or more processing steps, including heat treatment and UV exposure. Likewise, following development, the printing plate may be processed by, for example, heating or UV exposure.

Ink applied to the image area may then be imagewise transferred to a suitable receiving material (such as cloth, paper, metal, glass or plastic) to provide one or more desired impressions. If desired, an intermediate blanket roller may be used to transfer the ink from the printing plate to the receiving material. The printing plate may be cleaned between impressions, if desired, using conventional cleaning methods.

Printing plate precursors formed according to embodiments of the present invention possess several benefits when compared to previous on-press developable printing plates. First, the radiation sensitive layers of the present invention may be imaged at fast imaging speeds. For example, embodiments of the present invention may be imaged between about 75 and about 400 mJ/cm$^2$. Additionally, after imaging, imaged portions of the precursor are easily visually distinguishable from unimaged portions of the precursor due to a color change during imaging. This visible "printout" may provide for improved off-press and/or pre-press handling and evaluation of the printing plates. Further yet, printing plates formed according to embodiments of the present invention exhibit significantly improved run lengths and/or press durability.

The invention is further described in the following examples.

EXAMPLE 1

An aluminum substrate was treated by brush-graining and anodizing with phosphoric acid, and was then post-treated with polyacrylic acid. A coating mixture including the components of Table 1 was then applied to the substrate with a wire wound bar and dried for 60 seconds residence time in a Ranar conveyor oven (available from Ranar Manufacturing Co, Inc., El Segundo, Calif.) at 94° C. to form a radiation sensitive layer. The resulting weight of the radiation sensitive layer was 1.5 g/m$^2$.

TABLE 1

| COMPONENT | WEIGHT PERCENT |
|---|---|
| Urethane Acrylate | 1.98 |
| Graft Copolymer 1 | 3.70 |
| Graft Copolymer 2 | 0.40 |
| Irgacure 250 | 0.31 |
| IR Absorbing Dye 1 | 0.07 |
| Byk 336 | 0.15 |
| n-Propanol | 74.71 |
| Water | 18.68 |

Urethane acrylate was prepared by reacting Desmodur N100 (an aliphatic polyisocyanate resin based on hexamethylene diisocyanate available from Bayer Corp., Milford, Conn.) with hydroxyethyl acrylate and pentaerythritol triacrylate.

Graft copolymer 1 is a poly(oxy-1,2-ethanediyl), α-(2-methyl-1-oxo-2-propenyl)-ω-methoxy-, polymer grafted with ethenylbenzene, which is combined with the components of Table 1 as a 25% dispersion in an 80% n-propanol/

20% water solvent. Graft copolymer 2 is a methoxy polyethylene glycol methacrylate-allyl methacrylate graft copolymer, which is added to the components of Table 1 as a 10% dispersion in methyl ethyl ketone.

Irgacure 250 is an iodonium salt available from Ciba specialty Chemicals, Tarrytown, N.Y., as a 75% propylene carbonate solution and has the formula iodonium, (4-methylphenyl)[4-(2-methylpropyl)phenyl]-, hexafluorophosphate.

IR Absorbing Dye 1 is represented by the formula

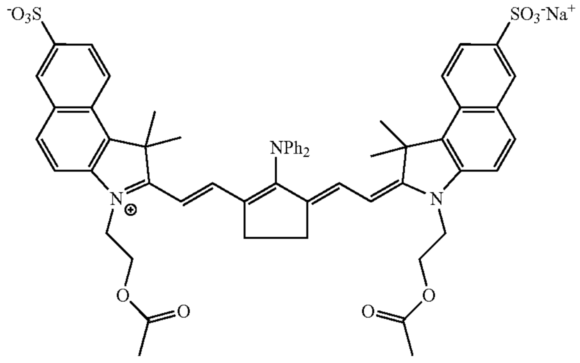

Byk 336 is a modified dimethyl polysiloxane copolymer available from Byk Chemie, Wallingford, Conn. in a 25% xylene/methoxypropyl acetate solution.

The resulting printing plate precursor was imaged on a Creo Trendsetter 3244x at an imaging speed of 350 mJ/cm$^2$ and was then mounted on a Komori press (available from Komori, Azumabashi, Sumida-ku, Tokyo) that was loaded with Graphics Equinox Ink and a fountain solution including Varn Litho Etch 142W (fountain) and Varn PAR (alcohol substitute) @ 3 oz/gal $H_2O$ each (available from Varn International, Addison, Ill.) The image areas of the imaged plate precursor were blue and easily visually distinguishable from the non-image areas. In order to increase the rate of plate wear, the Komori press was set up with a hard blanket over-packed 0.001" over aim (specified aim is 0.004"). The plate printed more than 50,000 satisfactory copies of the printing plate image in this environment.

COMPARATIVE EXAMPLE 2

The treated substrate reported in Example 1 was coated with the coating mixture provided in Table 2 via a wire-wound rod and was then dried for about 60 seconds residence time in the Ranar conveyor oven used in Example 1 at 94° C. to form a radiation sensitive layer. The resulting coating weight of the radiation sensitive layer was 1.5 g/m$^2$.

TABLE 2

| COMPONENT | PERCENT WEIGHT |
|---|---|
| Urethane Acrylate | 0.99 |
| SR399 | 0.99 |
| Graft Copolymer 1 | 3.52 |
| Graft Copolymer 2 | 0.40 |
| 2,4-tricholoromethyl(ethoxy ethyl napthyl)-6-triazine | 0.32 |
| N-phenyliminodiacetic acid | 0.17 |
| IR absorbing Dye 2 | 0.07 |
| Byk 336 | 0.15 |
| n-Propanol | 74.71 |
| Water | 18.68 |

SR399 is dipentaerythritol pentaacrylate available from Sartomer CO, Exton, Pa. in a 50% 1-methoxy-2-propanol solution. 2,4-tricholoromethyl(ethoxy ethyl napthyl)-6-triazine is available from Panchim, France. N-phenyliminodiacetic acid is available from Lancaster Synthesis Inc., Windham N.H. IR absorbing dye 2 is 2-[2-[2-[phenylthio-3-[(1,3-dihydro-1,3,3-trimethyl-2H-indol-2-ylidene)ethylidene]-1-cyclohexen-1-yl]ethenyl]-1,3,3-trimethyl-3H-indolium chloride. The resulting printing plate precursor was imaged on a Creo Trendsetter 3244x at an imaging speed of 400 mJ/cm$^2$, however the image area exhibited no color change after imaging when compared to the non-image area. The printing plate precursor was then mounted on a Komori press loaded with Graphics Equinox Ink and the fountain solution of Example 1. In order to increase the rate of plate wear, the Komori press was set up with a hard blanket over-packed by 0.001" over aim (specified aim was 0.004"). The plate printed only 5,000 satisfactory copies before wear was observed in the solid image areas.

Thus, despite the increased energy used during imaging, the printing plate in comparative Example 2 (which did not include an initiator system) printed substantially fewer satisfactory copies than the printing plate formed according to Example 1.

EXAMPLE 3

A substrate was electrochemically grained and anodized with sulfuric acid, and was then post-treated with polyvinyl phosphonic acid. The coating mixture reported in Table 1 was then applied, dried, imaged, and developed as in Example 1. After imaging, the image area exhibited a color change allowing for easy visual distinction of the image and non-image areas. The resulting plate printed 3,000 satisfactory copies of the printing plate image.

COMPARATIVE EXAMPLE 4

A substrate was electrochemically grained, anodized with sulfuric acid, and then post-treated with polyvinyl phosphonic acid as in Example 3. The coating mixture reported in Table 2 was then applied, dried, imaged, and developed as in Comparative Example 2. After imaging, the image area exhibited no color change when compared to the non-image area. The resulting plate printed less than 250 satisfactory copies of the printing plate image.

Thus, despite the increased energy used during imaging, the printing plate in comparative Example 4 printed substantially fewer satisfactory copies than the printing plate formed according to Example 3.

EXAMPLE 5

An aluminum substrate was treated by brush-graining and anodizing with phosphoric acid, and was then post-treated with polyacrylic acid. A coating mixture including the components of Table 3 was then applied to the substrate with a wire wound bar and dried for 60 seconds residence time in a Ranar conveyor oven (available from Ranar Manufacturing Co, Inc., El Segundo, Calif.) at 94° C. to form a radiation sensitive layer. The resulting coating weight of the solution was 1.5 g/$m^2$.

TABLE 3

| COMPONENT | WEIGHT PERCENT |
|---|---|
| Urethane Acrylate | 3.25 |
| Graft Copolymer 1 | 0.6 |
| Graft Copolymer 2 | 1.98 |
| Mercapto-3-triazole | 0.18 |
| Irgacure 250 | 0.32 |
| IR Absorbing Dye 1 | 0.07 |
| Klucel 99M | 0.07 |
| Byk 336 | 0.15 |
| n-Propanol | 74.70 |
| Water | 18.68 |

Mercapto-3-triazole refers to a mercapto-3-triazole-1H, 2, 4, available from PCAS, Paris, France. Klucel 99M is a hydroxypropyl cellulose thickener used as a 1 percent solution in water from Hercules, Heverlee, Belgium The resulting printing plate precursor was imaged on a Creo Trendsetter 3244x at an imaging speed of 350 mJ/$cm^2$ and was then mounted on a Komori press (available from Komori, Azumabashi, Sumida-ku, Tokyo) loaded with Graphics Equinox Ink and the fountain solution of Example 1. The image areas of the imaged plate precursor were blue and easily visually distinguishable from the non-imaged areas. In order to increase the rate of plate wear, the Komori press was set up with a hard blanket over-packed 0.001" over aim (specified aim is 0.004"). The plate printed more than 50,000 satisfactory copies of the printing plate image in this environment.

Another printing plate precursor formed as reported above was imaged with UV radiation using an Olec vacuum frame (5 kW bulb), available from Olec Corp, Irvine, Calif., for 50 units at medium intensity through a patterned mask. The resulting imaged printing plate precursor was placed on a Komori press under the conditions reported above. The plate successfully printed at least 50,000 copies of the pattern, at which point the printing run was terminated.

EXAMPLE 6

A printing plate precursor is formed according to Example 5, except that IR Absorbing Dye I is omitted. The resulting precursor is imaged with an Olec vacuum frame (5 kW bulb) for 100 units at a medium intensity through a patterned mask. The resulting imaged printing plate precursor is then mounted on an A. B. Dick (Chicago, Ill.) printing press, and successfully prints multiple copies of the pattern.

We claim:

1. A radiation sensitive composition comprising:

a carrier solvent, an initiator system comprising an onium salt and an infrared radiation absorber;

a polymerizable material; and a polymeric binder that is present as discrete particles and comprises a hydrophobic polymer backbone and a plurality of pendant groups represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is a hydrophobic segment, Y is a hydrophilic segment, wherein the pendant groups include polyalkylene oxide segments having from 12 to 250 alkylene oxide units.

2. The composition of claim 1 wherein the onium salt comprises a sulfonium, oxysulfoxonium, oxysulfonium, sulfoxonium, ammonium, selenonium, arsonium, phosphonium, diazonium, or halonium salt.

3. The composition of claim 2 wherein the halonium salt comprises an iodonium salt.

4. The composition of claim 3 wherein the iodonium salt comprises an iodonium salt having a positively-charged hypervalent iodine atom with two identical or different organic substituents.

5. The composition of claim 4 wherein the iodonium salt comprises (4-methylphenyl)[4-(2-methylpropyl)phenyl]iodonium and a counter-ion.

6. The composition of claim 4 wherein the iodonium salt comprises (4-methylphenyl)[4-(2-methylpropyl)phenyl]iodonium hexafluorophosphate.

7. The composition of claim 1 wherein the onium salt comprises a positively-charged hypervalent phosphorus atom with four organic substituents.

8. The composition of claim 1 wherein the onium salt comprises a triphenylsulfonium salt.

9. The composition of claim 1 wherein the onium salt comprises a quaternary nitrogen substituted with four organic substituents.

10. The composition of claim 1 wherein the onium salt comprises an N-alkoxypyridinium salt.

11. The composition of claim 1 wherein the onium salt comprises diphenyl iodonium chloride, diphenyl iodonium hexafluorophosphate, diphenyl iodonium hexafluoroantimonate, diphenyl iodonium octyl sulfate, diphenyl iodonium octyl thiosulfate, diphenyl iodonium-2-carboxylate, 4,4'-dicumyl iodonium chloride, 4,4'-dicumyl iodonium hexafluorophosphate, 4,4'-dicumyl iodonium p-tolyl sulfate, [4-[(2-Hydroxytetradecyl-oxy]-phenyl]phenyliodonium hexafluroantimonate, N-methoxy-α-picinolinium-p-toluene sulfonate, 4-methoxybenzene-diazonium tetrafluoroborate, 4,4'-bis-dodecylphenyl iodonium-hexafluorophosphate, 2-cyanoethyl-triphenylphosphonium chloride, bis-[4-diphenylsulfoniumphenyl]sulfide-bis-hexafluorophosphate, bis-4-dodecylphenyliodonium hexafluoroantimonate, triphenyl sulfonium hexafluoroantimonate, triphenyl sulfonium tetrafluoroborate, triphenyl sulfonium octyl sulfate, 2-methoxy-4-(phenylamino)-benzenediazonium hexadecyl sulfate, 2-methoxy-4-(phenylamino)-benzenediazonium vinyl benzyl thiosulfate, 2-methoxy-4-(phenylamino)-benzenediazonium octyl sulfate, 2-methoxy-4-aminophenyl diazonium hexafluorophosphate, phenoxyphenyl diazonium hexafluoroantimonate, or anilinophenyl diazonium hexafluoroantimonate.

12. The composition of claim 1 wherein the radiation sensitive composition comprises a UV radiation absorber.

13. The composition of claim 1 wherein the infrared radiation absorber comprises an anionic chromophore.

14. The composition of claim 13 wherein the infrared radiation absorber absorbs radiation in the range of from about 600 to about 1200 nm.

15. The composition of claim 1 wherein the infrared radiation absorber comprises an azo dye, squarilium dye, croconate dye, triarylamine dye, thiazolium dye, indolium dye, oxonol dye, oxaxolium dye, cyanine dye, merocyanine dye, indocyanine dye, indotricarbocyanine dye, oxatricarbocyanine dye, phthalocyanine dyes, thiocyanine dye, thiatricarbocyanine dye, merocyanine dye, cryptocyanine dye, naphthalocyanine dye, polyaniline dye, polypyrrole dye, polythiophene dye, chalcogenopyryloarylidene and bis (chalcogenopyrylo) polymethine dye, oxyindolizine dye, pyrylium dye, pyrazoline azo dye, oxazine dye, naphthoquinone dye, anthraquinone dye, quinoneimine dye, methine dye, arylmethine dye, squarine dye, oxazole dye, croconine dye, porphyrin dye, or derivatives or combinations thereof.

16. The composition of claim 15 wherein the infrared radiation absorber comprises a cyanine dye.

17. The composition of claim 1 wherein the infrared radiation absorber comprises

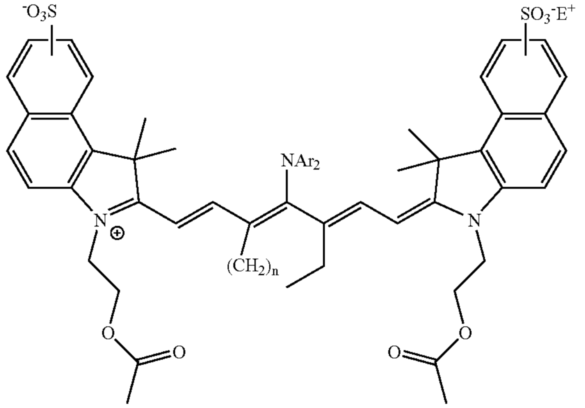

wherein Ar is a substituted or unsubstituted aryl, E is a positively charged counter-ion and n=1 or 2.

18. The composition of claim 1 wherein the infrared radiation absorber comprises a compound represented by the formula:

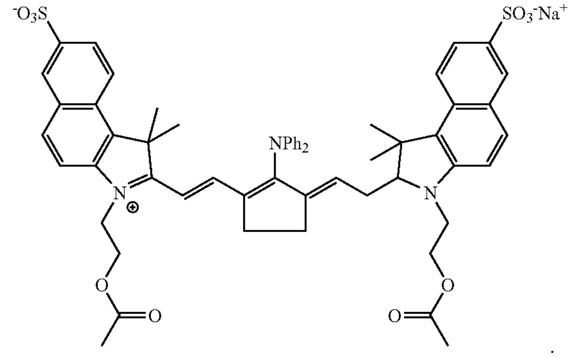

19. The composition of claim 1 wherein the initiator system comprises an iodonium salt and an infrared radiation absorber having an anionic chromophore.

20. The composition of claim 1 wherein the initiator system comprises (4-methylphenyl)[4-(2-methylpropyl)phenyl]iodonium and a counter-ion; and an infrared radiation absorber represented by the formula

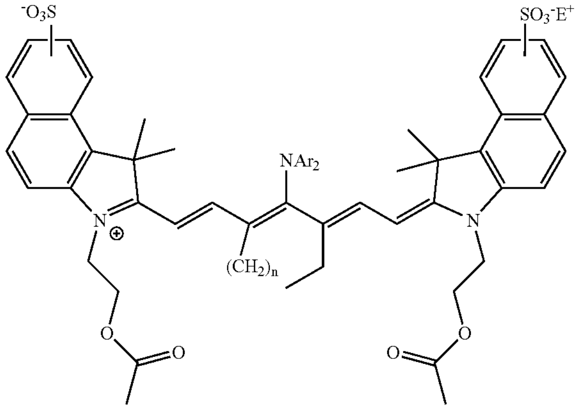

wherein Ar is a substituted or unsubstituted aryl, E is a positively charged counter-ion and n=1 or 2.

21. The composition of claim 1 wherein initiator system comprises:

(4-methylphenyl)[4-(2-methylpropyl)phenyl]iodonium hexafluorophosphate; and an infrared radiation absorber represented by the formula:

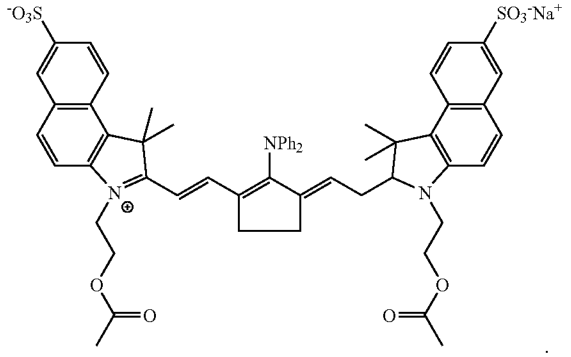

22. The composition of claim 1 wherein the polymerizable material includes an addition polymerizable ethylenically unsaturated group or a crosslinkable ethylenically unsaturated group.

23. The composition of claim 22, wherein the addition polymerizable ethylenically unsaturated group is polymerizable by free radical polymerization, cationic polymerization, or a combination thereof.

24. The composition of claim 1 wherein the polymerizable material comprises monomers having acrylate moieties, methacrylate moieties or combinations thereof.

25. The composition of claim 1 wherein the polymerizable material comprises urethane acrylate, urethane methacrylate or combinations thereof.

26. The composition of claim 1 wherein the polymerizable material comprises an aryl substituted vinyl moiety.

27. the composition of claim 1, wherein the pendant groups comprise polyethylene oxide segments.

28. The composition of claim 1 wherein W is represented by the formula:

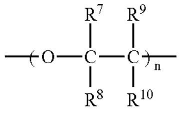 or 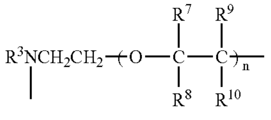

wherein each of $R^7$, $R^8$, $R^9$ and $R^{10}$ is hydrogen; $R^3$ is hydrogen or alkyl; and wherein the hydrophilic segment of Y is hydrogen, $R^{15}$, OH, $OR^6$, COOH, $COOR^{16}$, $O_2CR^{16}$, segment represented by the formula:

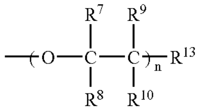 or 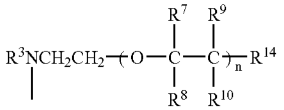

wherein each of $R^7$, $R^8$, $R^9$ and $R^{10}$ is a hydrogen atom; $R^3$ is hydrogen or alkyl; wherein each of $R^{13}$, $R^{14}$, $R^{15}$ and $R^{16}$ is hydrogen or alkyl of 1-5 carbon atoms and wherein the hydrophobic segment is a linear, branched or cyclic alkyl of 6-120 carbon atoms, a haloalkyl of 6-120 carbon atoms, an aryl of 6-120 carbon atoms, an alkaryl of 6-120 carbon atoms, an aralkyl of 6-120 carbon atoms, $OR^{17}$, $COOR^{17}$ or $O_2CR^{17}$, wherein $R^{17}$ is an alkyl of 6-20 carbon atoms; and wherein n is from about 12 to about 250.

29. The composition of claim 1, wherein the polymeric binder is a graft copolymer comprising repeating units represented by the formula:

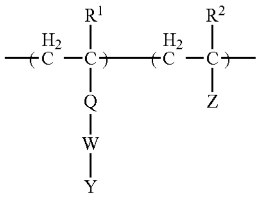

wherein each of $R^1$ and $R^2$ is independently hydrogen, alkyl, aryl, aralkyl, alkaryl, $COOR^5$, $R^6CO$, halogen or cyano; wherein each of $R^5$ and $R^6$ is independently alkyl, aryl, aralkyl or alkaryl; Q is:

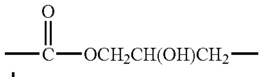; 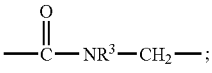;

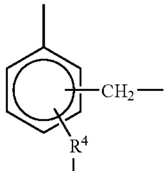 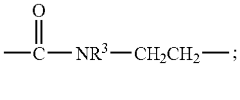; 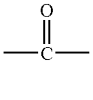;

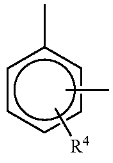; 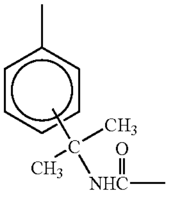;

wherein $R^3$ is hydrogen or alkyl; $R^4$ is hydrogen, alkyl, halogen, cyano, nitro, alkoxy, alkoxycarbonyl, acyl or a combination thereof; W is a hydrophilic segment or a hydrophobic segment; Y is a hydrophilic segment or a hydrophobic segment; Z is hydrogen, alkyl, halogen, cyano, acyloxy, alkoxy, alkoxycarbonyl, hydroxyalkyloxycarbonyl, acyl, aminocarbonyl, aryl or substituted aryl; with the proviso that when W is a hydrophilic segment, Y is a hydrophilic segment or a hydrophobic segment, with the further proviso that when W is a hydrophobic segment, Y is a hydrophilic segment.

30. The composition of claim 27 wherein the polyethylene oxide segments are present in the polymeric binder in an amount ranging from about 0.5 to about 60% by weight of the polymeric binder.

31. The composition of claim 1 further comprising at least one dispersing agent, humectant, biocide, plasticizer, surfactant, viscosity builder, colorant, pH adjuster, drying agent, defoamer, preservative, antioxidant, development aid, rheology modifier or a combination thereof.

32. The composition of claim 1 further comprising a mercaptan derivative.

33. The composition of claim 1 further comprising a mercaptotriazole compound.

34. The composition of claim 1 further comprising a hydroxypropyl cellulose, hydroxyethyl cellulose, carboxymethyl cellulose or polyvinyl pyrrolidone material.

35. The composition of claim 1 wherein the composition is soluble or dispersible in aqueous solutions or liquid developers.

36. The composition of claim 1 wherein the composition is soluble or dispersible in water.

37. An imageable element comprising:

a substrate; and a radiation sensitive layer applied to the substrate as a composition comprising a carrier solvent, an initiator system comprising an onium salt and an infrared radiation absorber, a polymerizable material, and a polymeric binder that is present as discrete particles and comprises a hydrophobic polymer backbone and a plurality of pendant groups represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is a hydrophobic segment, Y is a hydrophilic segment, wherein the pendant groups include polyalkylene oxide segments having from 12 to 250 alkylene oxide units.

38. The imageable element of claim 37 wherein the initiator system comprises an iodonium salt and an infrared radiation absorber comprising an anionic chromophore.

39. The imageable element of claim 37 wherein the substrate comprises aluminum.

40. The imageable element of claim 39 wherein the substrate is treated by graining, anodizing or combinations thereof.

41. The imageable element of claim 40 wherein the substrate is post treated with polyacrylic acid.

42. The imageable element of claim 37 wherein the radiation sensitive layer is developable in aqueous solutions or liquid developers.

43. The imageable element of claim 37 wherein the radiation sensitive layer is developable in water.

44. The imageable element of claim 37 wherein the radiation sensitive layer is developable in fountain solution, ink or both.

45. The imageable element of claim 37, wherein the imageable element is a printing plate precursor.

46. The imageable element of claim 45 wherein the printing plate precursor is developable on-press.

47. An imageable element comprising:

a substrate; and a radiation sensitive layer applied to the substrate as a composition comprising a carrier solvent, an initiator system comprising a UV radiation sensitive onium salt, a polymerizable material, and a polymeric binder that is present as discrete particles and comprises a hydrophobic polymer backbone and a plurality of pendant groups represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is a hydrophobic segment, Y is a hydrophilic segment, wherein the pendant groups include polyalkylene oxide segments having from 12 to 250 alkylene oxide units.

48. The imageable element of claim 47 wherein the initiator system further comprises an infrared radiation absorber.

49. A method of making a printing plate precursor comprising:

providing a substrate;

applying onto the substrate a coating mixture comprising a carrier solvent, an initiator system comprising an onium salt and an IR radiation absorber, a polymerizable material, and a polymeric binder that is present as discrete particles and comprise a hydrophobic polymer backbone and a plurality of pendant groups represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is a hydrophobic segment, Y is a hydrophilic segment; and drying the coating mixture to form a radiation sensitive layer on the substrate, wherein the pendant groups include polyalkylene oxide segments having from 12 to 250 alkylene oxide units.

50. The method of claim 49 wherein the carrier comprises an aqueous carrier.

51. The method of claim 49 wherein the carrier comprises a mixture of water and a water miscible organic liquid.

52. The method of claim 49 wherein the coating mixture further comprises at least one surfactant.

53. A method of making a printing plate comprising:

providing a printing plate precursor comprising:

a substrate; and a radiation sensitive layer applied as a composition to the substrate comprising a carrier solvent, an initiator system comprising an onium salt and an infrared radiation absorber, a polymerizable material, and a polymeric binder that is present as discrete particles and comprises a hydrophobic polymer backbone and a plurality of pendant groups represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is a hydrophobic segment, Y is a hydrophilic segment, wherein the pendant groups include polyalkylene oxide segments having from 12 to 250 alkylene oxide units;

imagewise exposing the radiation sensitive layer to radiation such that exposed portions of the radiation sensitive layer we less developable in a developer than unexposed portions of the radiation sensitive layer; and contacting the imagewise exposed radiation sensitive layer with a developer such that unexposed portions of the radiation sensitive layer are removed from the printing plate precursor.

54. The method of claim 53 wherein at least one of the imagewise exposing and contacting steps occurs on-press.

55. The method of claim 54 wherein the imaging step occurs off-press and the contacting step occurs on-press.

56. The method of claim 53 wherein the developer comprises aqueous solutions or liquid developers.

57. The method of claim wherein the developer comprises water.

58. The method of claim 53 wherein the developer comprises fountain solution, ink or both.

59. The method of claim 53 further comprising processing the printing plate after the contacting step.

60. The method of claim 59 wherein the processing step comprises heating the printing plate, exposing the printing plate to UV radiation or both.

61. The method of claim 53 further comprising processing the printing plate prior to the contacting step.

62. The method of claim 61 wherein the processing step comprises heating the printing plate, exposing the printing plate to UV radiation or both.

63. The method of claim 53 wherein the step of exposing includes exposing the radiation sensitive layer to infrared radiation.

64. The method of claim 63 wherein the step of exposing is performed with a laser emitting radiation at a wavelength between about 600 and about 1200 nm.

65. The method of claim 63 wherein the step of exposing includes exposing the radiation sensitive layer to infrared radiation at between about 75 and 400 $mJ/cm^2$.

66. An imageable element comprising a substrate having therein a radiation sensitive layer comprising:

an initiator system comprising an onium salt and an infrared radiation absorber;

a polymerizable material; and a polymeric binder comprising a hydrophobic polymer backbone and a plurality of pendant groups 53 represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is a hydrophobic segment, Y is a hydrophilic segment, wherein the pendant groups include polyalkylene oxide segments having from 12 to 250 alkylene oxide units, wherein the infrared radiation absorber comprises

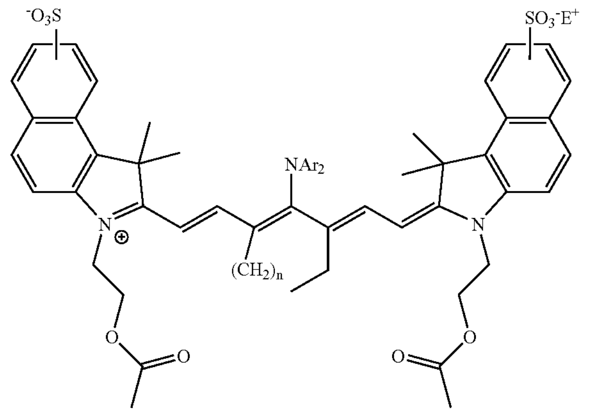

wherein Ar is a substituted or unsubstituted aryl, E is a positively charged counter-ion and n=1 or 2.

67. An imageable element comprising a substrate having thereon a radiation sensitive layer comprising:

an initiator system comprising an onium salt and an infrared radiation absorber;

a polymerizable material; and a polymeric binder comprising a hydrophobic polymer backbone and a plurality of pendant groups represented by the formula:

-Q-W-Y wherein Q is a difunctional connecting group; W is a hydrophilic segment or a hydrophobic segment; Y is a hydrophilic segment or a hydrophobic segment; with the proviso that when W is a hydrophilic segment, Y is a hydrophilic segment or a hydrophobic segment; with the further proviso that when W is a hydrophobic segment, Y is a hydrophilic segment, wherein the pendant groups include polyalkylene oxide segments having from 12 to 250 alkylene oxide units, wherein the initiator system comprises an iodonium salt and an infrared radiation absorber having an anionic chromophore.

* * * * *

UNITED STATES PATENT AND TRADEMARK OFFICE

CERTIFICATE OF CORRECTION

PATENT NO. : 7,368,215 B2 
APPLICATION NO. : 10/436506
DATED : May 6, 2008
INVENTOR(S) : Heidi M. Munnelly et al.

It is certified that error appears in the above-identified patent and that said Letters Patent is hereby corrected as shown below:

| | |
|---|---|
| Column 22, Line 66 | In Claim 27, before "composition" delete "the" and insert -- The --, therefor. |
| Column 22, Line 66 | In Claim 27, before "pendant" insert -- -Q-W-Y --. |
| Column 23, Line 13 | In Claim 28, delete "$OR^6$," and insert -- $OR^{16}$, --, therefor. |
| Column 23, Line 14 | In Claim 28, before "segment" insert -- a --. |
| Column 26, Line 40 | In Claim 53, delete "we" and insert -- are --, therefor. |
| Column 26, Line 40 | In Claim 57, after "claim" insert -- 53 --. |
| Column 27, Line 25 | In Claim 66, after "groups" delete "53". |

Signed and Sealed this

Eleventh Day of August, 2009

David J. Kappos

David J. Kappos
*Director of the United States Patent and Trademark Office*